(12) United States Patent
Wang

(10) Patent No.: US 9,257,634 B2
(45) Date of Patent: Feb. 9, 2016

(54) PIEZOELECTRIC ELEMENT, LIQUID EJECTING HEAD, LIQUID EJECTING APPARATUS, ACTUATOR, SENSOR, AND PIEZOELECTRIC MATERIAL

(71) Applicant: Seiko Epson Corporation, Tokyo (JP)

(72) Inventor: Xiaoxing Wang, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/731,847

(22) Filed: Jun. 5, 2015

(65) Prior Publication Data

US 2015/0364675 A1    Dec. 17, 2015

(30) Foreign Application Priority Data

Jun. 16, 2014  (JP) ................................. 2014-123133

(51) Int. Cl.
| | |
|---|---|
| *B41J 2/045* | (2006.01) |
| *H01L 41/187* | (2006.01) |
| *H01L 41/18* | (2006.01) |
| *B41J 2/14* | (2006.01) |
| *H01L 41/09* | (2006.01) |
| *H01L 41/113* | (2006.01) |

(52) U.S. Cl.
CPC ......... *H01L 41/1878* (2013.01); *B41J 2/14201* (2013.01); *B41J 2/14233* (2013.01); *H01L 41/09* (2013.01); *H01L 41/1132* (2013.01); *H01L 41/18* (2013.01); *H01L 41/183* (2013.01); *H01L 41/1871* (2013.01)

(58) Field of Classification Search
CPC ........ B41J 2/161; B41J 2/1628; B41J 2/1632; B41J 2/1646; B41J 2/1623; B41J 2/1629; B41J 2/1642; B41J 2/1645; B41J 2/14233; B41J 2/16201; B41J 2202/14419; B41J 2/14241; B41J 2202/03

See application file for complete search history.

(56) References Cited

U.S. PATENT DOCUMENTS

| | | | |
|---|---|---|---|
| 7,948,155 B2* | 5/2011 | Hishinuma | ......... B41J 2/14233 310/340 |
| 2009/0140197 A1 | 6/2009 | Aoki et al. | |
| 2009/0230211 A1 | 9/2009 | Kobayashi et al. | |
| 2011/0007115 A1 | 1/2011 | Kobayashi et al. | |
| 2012/0117770 A1 | 5/2012 | Sakai | |
| 2012/0206545 A1* | 8/2012 | Kato | ..................... B41J 2/14233 347/70 |

FOREIGN PATENT DOCUMENTS

| | | | |
|---|---|---|---|
| JP | 2001-223404 A | 8/2001 | |
| JP | 2009-242229 A | 10/2009 | |
| JP | 2009-252789 A | 10/2009 | |

(Continued)

*Primary Examiner* — Juanita D Jackson
(74) *Attorney, Agent, or Firm* — Harness, Dickey & Pierce, P.L.C.

(57) ABSTRACT

A piezoelectric element 300 includes a first electrode 60, a piezoelectric layer 70 which is provided on the first electrode, and a second electrode 80 which is provided on the piezoelectric layer, and the piezoelectric layer is made of a piezoelectric material expressed as a mixed crystal including a first component formed of a complex oxide containing Bi and Fe and having a rhombohedral perovskite structure and a complex oxide containing Ba and Ti and having a tetragonal perovskite structure, a second component formed of a complex oxide containing Bi, K, and Ti and having a tetragonal perovskite structure, and a third component formed of a complex oxide containing Bi, Mg, and Ti and having a rhombohedral perovskite structure.

15 Claims, 14 Drawing Sheets

(56) References Cited

FOREIGN PATENT DOCUMENTS

| JP | 2010-053422 A | 3/2010 |
| JP | 2010-214841 A | 9/2010 |
| JP | 2011-035385 A | 2/2011 |
| JP | 2012-109361 A | 6/2012 |
| JP | 2014-116610 A | 6/2014 |

* cited by examiner

FIG. 4
(a) EXAMPLE 1
BFM/BT/BKT/BMT: 65/25/5/5
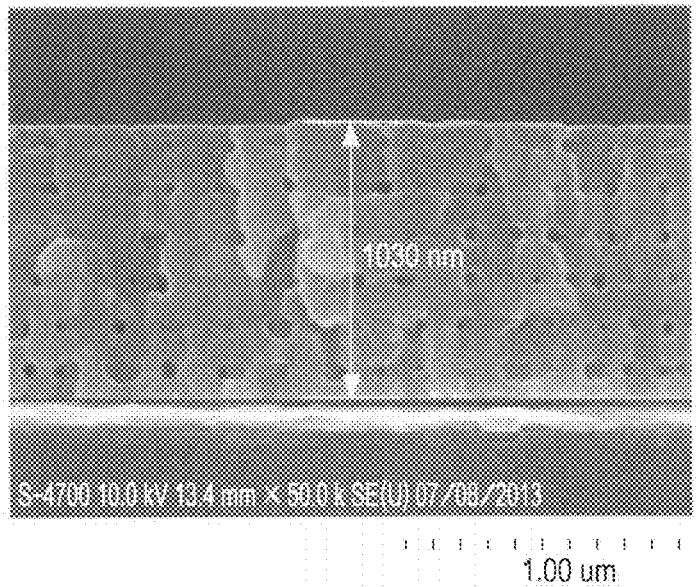
1.00 um
(b) EXAMPLE 2
BFM/BT/BKT/BMT: 60/30/5/5
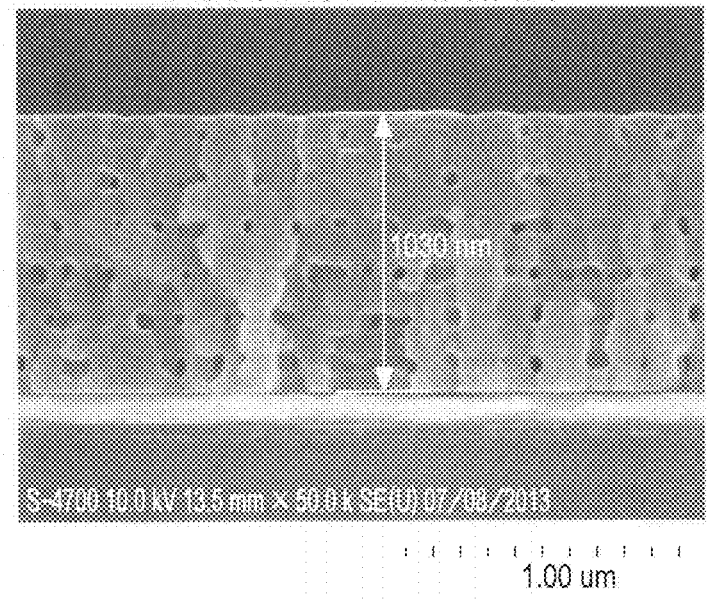
1.00 um FIG. 5
(a) EXAMPLE 3
BFM/BT/BKT/BMT: 60/25/10/5
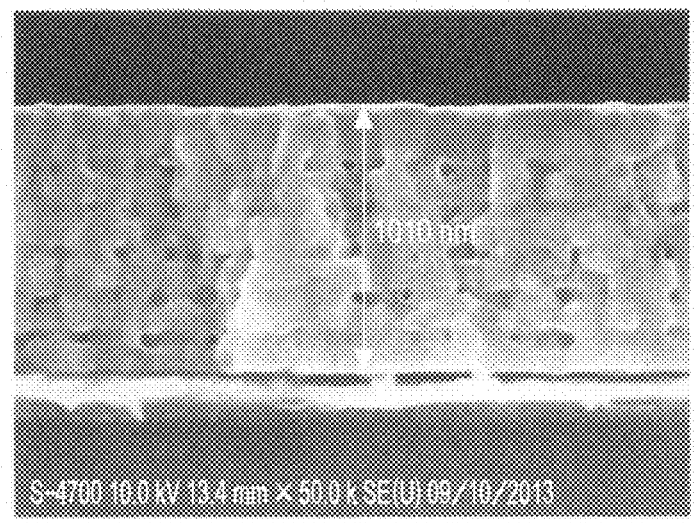
1.00 um
(b) EXAMPLE 4
BFM/BT/BKT/BMT: 55/25/10/10
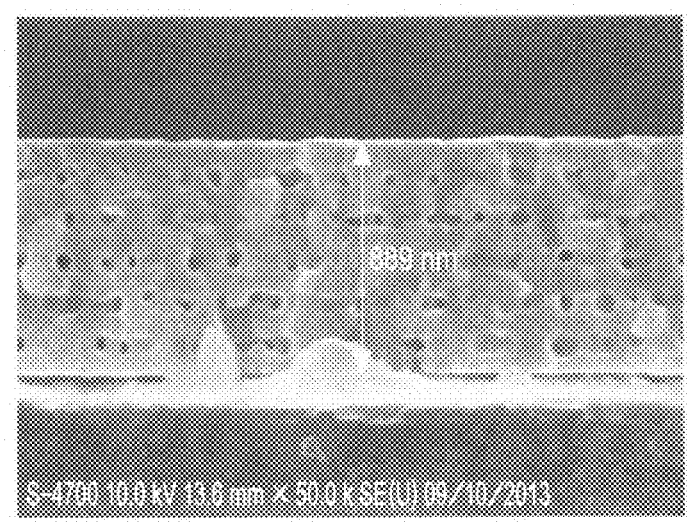
1.00 um

COMPARATIVE EXAMPLE 1
BFM/BT: 75/25

COMPARATIVE EXAMPLE 1

PIEZOELECTRIC ELEMENT, LIQUID EJECTING HEAD, LIQUID EJECTING APPARATUS, ACTUATOR, SENSOR, AND PIEZOELECTRIC MATERIAL

TECHNICAL FIELD

The present invention relates to a piezoelectric element, a liquid ejecting head, a liquid ejecting apparatus, an actuator, a sensor, and a piezoelectric material.

BACKGROUND

There are piezoelectric elements having a configuration in which a piezoelectric layer made of a piezoelectric material having an electromechanical conversion function, for example, a crystallized piezoelectric material is placed between two electrodes. Such piezoelectric elements are mounted on liquid ejecting heads as, for example, a flexure-mode actuator device. As a representative example of the liquid ejecting head, for example, there are ink jet recording heads in which a vibrating plate configures a part of a pressure generation chamber communicating with a nozzle opening which discharges ink droplets, and this vibrating plate is deformed by a piezoelectric element to pressurize an ink in the pressure generation chamber to thus discharge ink droplets from the nozzle opening.

As a piezoelectric material used in such piezoelectric elements, for example, lead-based piezoelectric ceramics represented by lead zirconate titanate (PZT) are usually used (for example, see JP-A-2001-223404). However, the development of a piezoelectric material containing no lead, that is, a lead-free piezoelectric material advances from the viewpoint of environmental problems. Examples of the lead-free piezoelectric material include barium titanate ($BaTiO_3$) having a perovskite structure represented by $ABO_3$ and bismuth ferrate ($BiFeO_3$) (for example, see JPA-2009-252789).

However, in the case of the lead-free piezoelectric material, the leak current is large and the displacement amount is insufficient as compared to lead zirconate titanate (PZT). Accordingly, for example, ink jet recording heads have a problem in that large liquid droplets are not easily discharged. In order to improve leakage characteristics and displacement characteristics of such a lead-free piezoelectric material, a technology of substituting a part of an element occupying the A-site of the perovskite structure and an element occupying the B-site with an element having different ion valency and a different ionic radius is proposed (for example, see JP-A-2010-214841 and JP-A-2011-035385).

However, in order to obtain leakage characteristics and displacement characteristics comparable to a lead (Pb)-based piezoelectric material, it is necessary to further examine and optimize the selection of a substitution site or a substitution element in the perovskite structure, a substitution amount and the like. Such a problem is not limited to piezoelectric elements which are mounted on ink jet recording heads, but exists also in other liquid ejecting heads which discharges liquid droplets other than an ink, liquid ejecting apparatuses, and piezoelectric elements which are mounted on sensors.

An object of the invention is to provide a piezoelectric element, a liquid ejecting head, a liquid ejecting apparatus, an actuator, a sensor, and a piezoelectric material in which the leak current can be reduced and the displacement amount can be improved in view of the circumstances.

SUMMARY

According to an aspect of the invention solving the above-mentioned problem, there is a provided a piezoelectric element including: a first electrode; a piezoelectric layer which is provided on the first electrode; and a second electrode which is provided on the piezoelectric layer, in which the piezoelectric layer is made of a piezoelectric material expressed as a mixed crystal including a first component formed of a complex oxide containing Bi and Fe and having a rhombohedral perovskite structure and a complex oxide containing Ba and Ti and having a tetragonal perovskite structure, a second component formed of a complex oxide containing Bi, K, and Ti and having a tetragonal perovskite structure, and a third component formed of a complex oxide containing Bi, Mg, and Ti and having a rhombohedral perovskite structure. In the aspect, by simultaneously introducing $(Bi_{0.5}K_{0.5})TiO_3$ having a tetrahedral structure and $Bi(Mg_{0.5}Ti_{0.5})O_3$ having a rhombohedral structure to $BiFeMnO_3$—$BaTiO_3$, $Fe^{2+}$ is suppressed, a lattice distortion effect and a morphotropic phase boundary (MPB) effect can be utilized, and thus high piezoelectric displacement and a low leak current can be realized. In addition, since no lead is contained, the load on the environment can be reduced.

Here, it is preferable that the first component is $Bi(Fe,Mn)O_3$—$BaTiO_3$, the second component is $(Bi_{0.5}K_{0.5})TiO_3$, and the third component is $Bi(Mg_{0.5}Ti_{0.5})O_3$. According to this, the generation of $Fe^{2+}$ is more securely suppressed, the lattice distortion effect and the morphotropic phase boundary (MPB) effect can be utilized, and thus high piezoelectric displacement and a low leak current can be realized. Accordingly, a large displacement amount can be obtained.

Further, it is preferable that in the first, second, and third components, the ratio of the complex oxide of the rhombohedral crystal to the complex oxide of the tetragonal crystal (complex oxide of rhombohedral crystal/complex oxide of tetragonal crystal) is 70/30 to 65/35. According to this, the generation of $Fe^{2+}$ is more securely suppressed, and thus the leak current can be further reduced.

Further, it is preferable that the content of the complex oxide containing Ba and Ti and having a tetragonal perovskite structure is 25 mol % to 30 mol %. According to this, the generation of $Fe^{2+}$ is more securely suppressed, and thus the leak current can be further reduced.

Further, it is preferable that the content of the second component is 5 mol % to 10 mol %. According to this, the generation of $Fe^{2+}$ is more securely suppressed, and thus the leak current can be further reduced.

Further, it is preferable that the content of the third component is 5 mol % to 10 mol %. According to this, the generation of $Fe^{2+}$ is more securely suppressed, and thus the leak current can be further reduced.

Further, it is preferable that the total content of the second component and the third component is 10 mol % to 20 mol %. According to this, the generation of $Fe^{2+}$ is more securely suppressed, and thus the leak current can be further reduced.

Further, it is preferable that an orientation control layer made of bismuth manganate is formed between the first electrode and the piezoelectric layer. According to this, the piezoelectric layer is more preferentially oriented to a (100) plane and a displacement amount is improved.

According to another aspect of the invention, there is provided a liquid ejecting head including the piezoelectric element according to any one of the above aspects. In the aspect, $Fe^{2+}$ is suppressed, the lattice distortion effect and the morphotropic phase boundary (MPB) effect can be utilized, and thus high piezoelectric displacement and a low leak current can be realized. In addition, since no lead is contained, the load on the environment can be reduced.

According to another aspect of the invention, there is provided a liquid ejecting apparatus including the liquid ejecting head. In the aspect, $Fe^{2+}$ is suppressed, the lattice distortion effect and the morphotropic phase boundary (MPB) effect can be utilized, and thus high piezoelectric displacement and a low leak current can be realized. In addition, since no lead is contained, the load on the environment can be reduced.

According to another aspect of the invention, there is provided an actuator and a sensor each including the piezoelectric element according to any one of the above aspects. In the aspect, $Fe^{2+}$ is suppressed, the lattice distortion effect and the morphotropic phase boundary (MPB) effect can be utilized, and thus high piezoelectric displacement and a low leak current can be realized. In addition, since no lead is contained, the load on the environment can be reduced.

According to another aspect of the invention, there is provided a piezoelectric material which is formed of a piezoelectric material expressed as a mixed crystal including a first component formed of a complex oxide containing Bi and Fe and having a rhombohedral perovskite structure and a complex oxide containing Ba and Ti and having a tetragonal perovskite structure, a second component formed of a complex oxide containing Bi, K, and Ti and having a tetragonal perovskite structure, and a third component formed of a complex oxide containing Bi, Mg, and Ti and having a rhombohedral perovskite structure. In the aspect, $Fe^{2+}$ is suppressed, the lattice distortion effect and the morphotropic phase boundary (MPB) effect can be utilized, and thus high piezoelectric displacement and a low leak current can be realized. In addition, since no lead is contained, the load on the environment can be reduced.

BRIEF DESCRIPTION OF DRAWINGS

FIG. 4 shows SEM images of examples.

FIG. 5 shows SEM images of examples.

DETAILED DESCRIPTION

Embodiment 1

Figure 1:
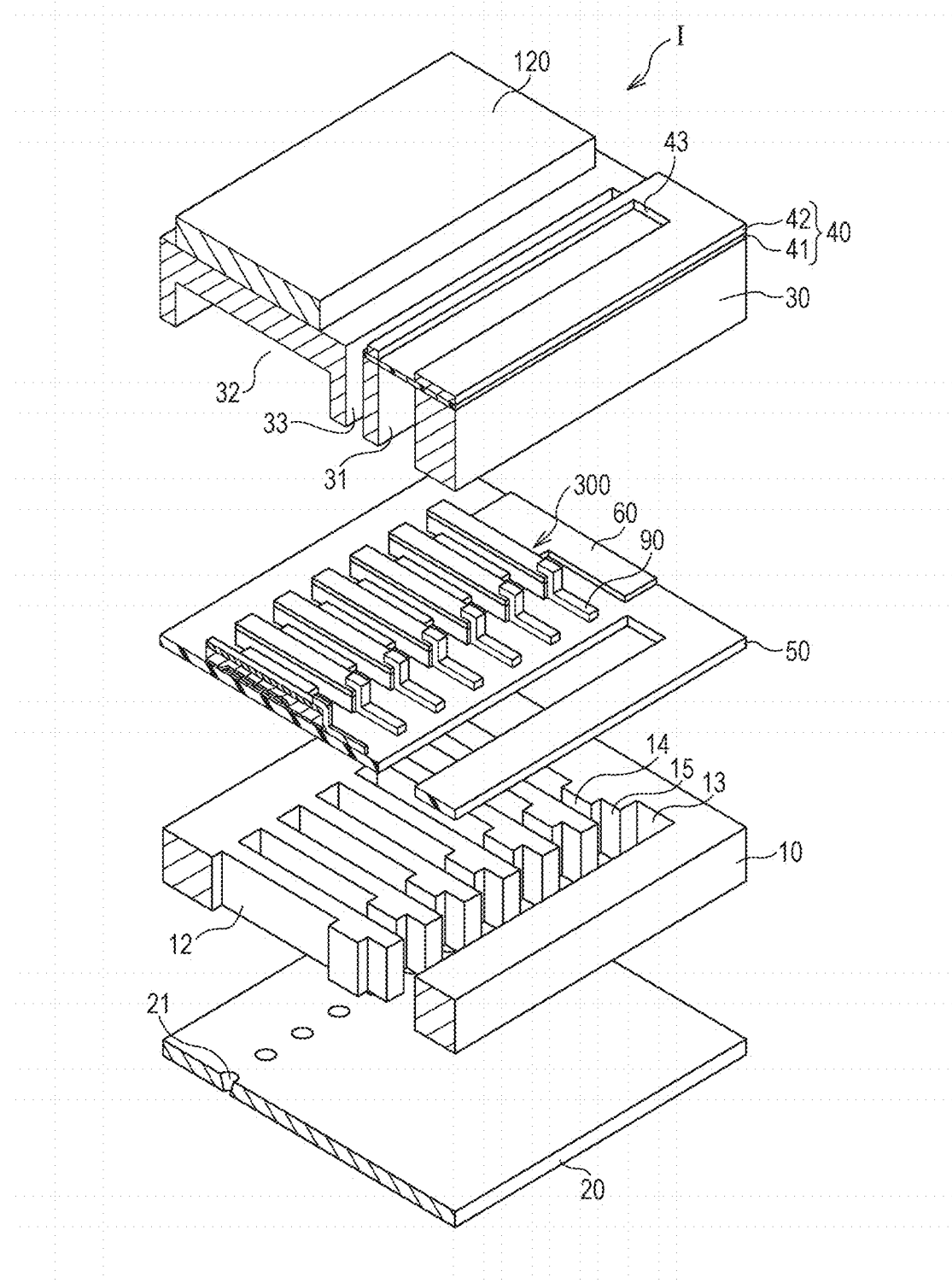
FIG. 1 is an exploded perspective view showing a schematic configuration of a recording head according to Embodiment 1.
Figure 2:
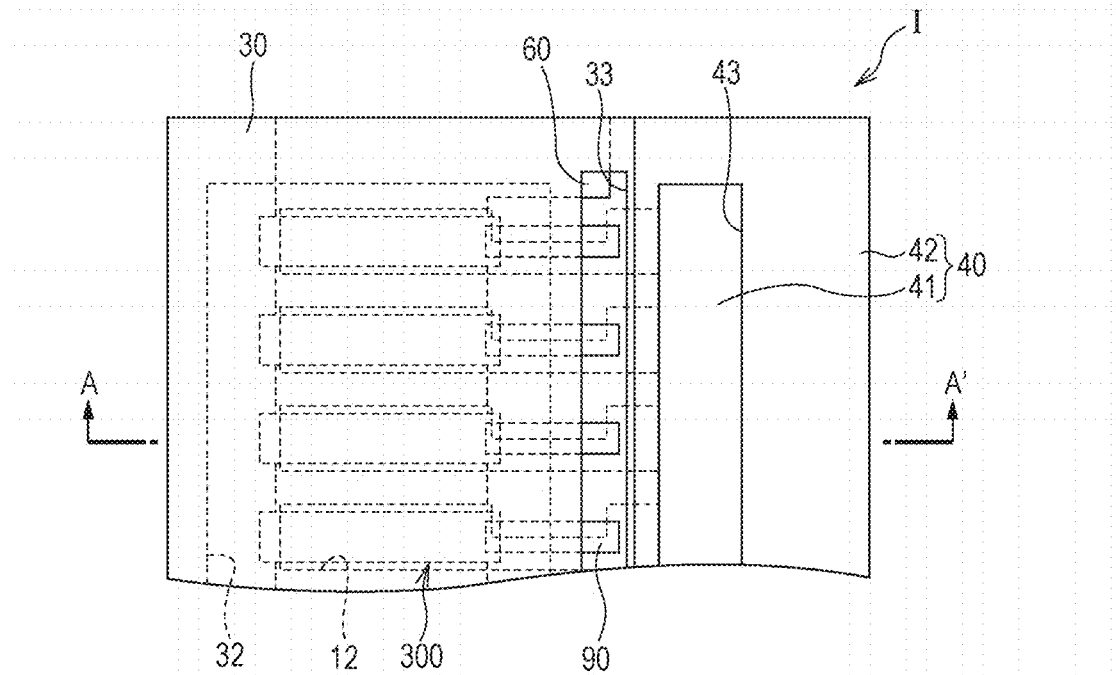
FIG. 2 is a plan view of the recording head according to Embodiment 1.
Figure 3:
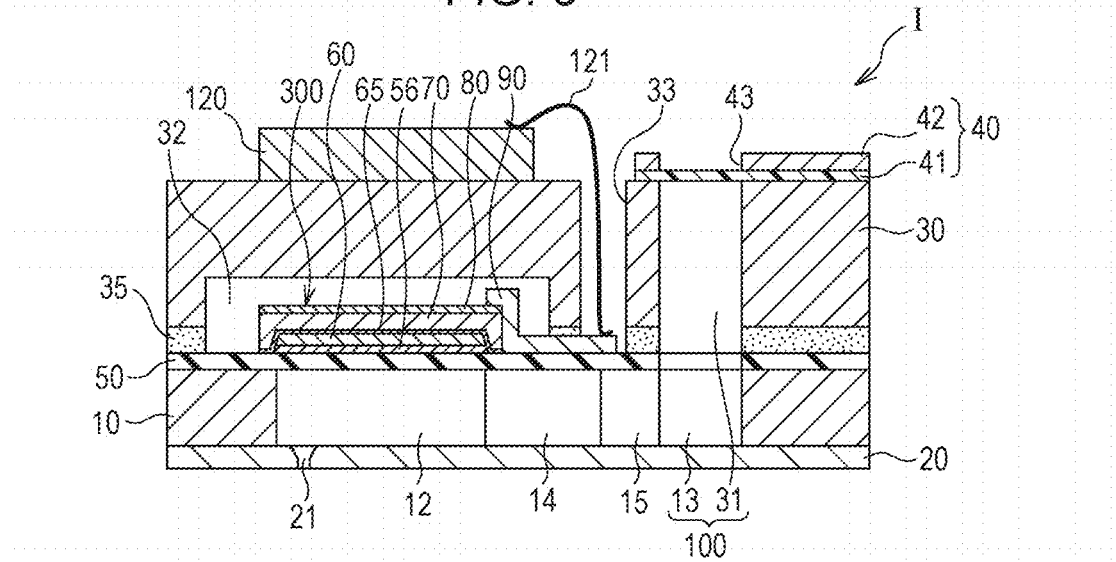
FIG. 3 is a cross-sectional view of the recording head according to Embodiment 1.

FIG. 1 is an exploded perspective view of an ink jet recording head which is an example of a liquid ejecting head according to Embodiment 1 of the invention. FIG. 2 is a plan view of FIG. 1, and FIG. 3 is a cross-sectional view taken along line A-A' of FIG. 2. As shown in FIGS. 1 to 3, a channel forming substrate 10 of this embodiment is formed of a silicon single crystal substrate, and on one surface thereof, an elastic film 50 made of silicon dioxide is formed.

In the channel forming substrate 10, a plurality of pressure generation chambers 12 are arranged in a width direction thereof. A communication portion 13 is formed in a region on the outside of the pressure generation chamber 12 of the channel forming substrate 10 in a longitudinal direction, and the communication portion 13 and each pressure generation chamber 12 communicate with each other via an ink supply path 14 and a communication path 15 provided for each pressure generation chamber 12. The communication portion 13 configures a part of a manifold serving as an ink chamber common to the pressure generation chambers 12 in communication with a manifold portion 31 of a protective substrate to be described later. The ink supply path 14 is formed with a width smaller than that of the pressure generation chamber 12 and keeps the channel resistance of the ink flowing from the communication portion 13 to the pressure generation chamber 12 constant. In this embodiment, the ink supply path 14 is formed by narrowing the width of the channel on one side, but may be formed by narrowing the width of the channel on both sides. The ink supply path may be formed by narrowing in a thickness direction, not by narrowing the width of the channel. In this embodiment, the channel forming substrate 10 is provided with a liquid channel formed of the pressure generation chambers 12, the communication portion 13, the ink supply paths 14, and the communication paths 15.

On the opening surface side of the channel forming substrate 10, a nozzle plate 20 having nozzle openings 21 communicating with the vicinity of an end portion of each pressure generation chamber 12 on the opposite side to the ink supply path 14 is fixed by an adhesive, a thermal bonding film, or the like. The nozzle plate 20 is formed of, for example, glass ceramics, a silicon single crystal substrate, stainless steel, or the like.

The elastic film 50 is formed as described above on the opposite side to the opening surface of the channel forming substrate 10, and on this elastic film 50, for example, an adhesion layer 56, made of titanium oxide having a thickness of approximately 30 nm to 50 nm, for improving adhesiveness between the elastic film 50 and a first electrode 60 is provided. The material of the adhesion layer 56 varies depending on the kind of the first electrode 60 and its ground, or the like. However, for example, an oxide or nitride containing titanium, zirconium, or aluminum, or $SiO_2$, MgO, $CeO_2$, or the like may be used. If necessary, an insulating film made of zirconium oxide may be provided on the elastic film 50.

On this adhesion layer 56, the first electrode 60 made of platinum (Pt), iridium (Ir), or the like, an orientation control layer 65 to be described later in detail which preferentially orients a piezoelectric layer 70 to a (100) plane, the piezoelectric layer 70, and a second electrode 80 are stacked and formed to configure a piezoelectric element 300 as pressure generation means for making a change in pressure in the pressure generation chamber 12. Here, the piezoelectric element 300 is a portion including the first electrode 60, the orientation control layer 65, the piezoelectric layer 70, and the second electrode 80. Generally, one of the electrodes of the piezoelectric element 300 acts as a common electrode, and the other electrode and the piezoelectric layer 70 are subjected to patterning for each pressure generation chamber 12. In this embodiment, the first electrode 60 acts as a common electrode of the piezoelectric element 300, and the second electrode 80 acts as an individual electrode of the piezoelectric element 300. However, there is no problem even when the electrodes are reversed due to the circumstances of the driving circuit or wiring. Here, the piezoelectric element 300 and the vibrating plate which is displaced by driving of the piezoelectric element 300 will be both referred to as an actuator device. In the above-described example, the elastic film 50, the adhesion layer 56, the first electrode 60, and the insulating film which is provided if necessary act as an insulating plate, but needless to say, the configuration is not limited thereto. For example, the elastic film 50 or the adhesion layer 56 may not be provided. The piezoelectric element 300 itself may substantially double as the vibrating plate. When the first electrode 60 is directly provided on the channel forming substrate 10, the first electrode 60 is preferably protected with an insulating protective film or the like so as to prevent conduction of the first electrode 60 and an ink.

The orientation control layer 65 of this embodiment preferentially orients the piezoelectric layer 70 formed on the orientation control layer 65 to the (100) plane. Here, the expression "preferentially orients . . . to the (100) plane" includes a case in which all of the crystals of the piezoelectric layer 70 are oriented to the (100) plane and a case in which most crystals (for example, 50% or more) are oriented to the (100) plane.

In this embodiment, such an orientation control layer 65 is made of an oxide containing Ti and Mn, specifically, bismuth manganite ($BiMnO_3$).

The orientation control layer 65 is not limited to this and may be made of a complex oxide having a perovskite structure and containing at least one or more selected from bismuth (Bi), manganese (Mn), iron (Fe), and titanium (Ti). Specific examples thereof include a complex oxide containing Bi and Mn, a complex oxide containing Bi, Mn, and Fe, and a complex oxide containing Bi, Fe, and Ti. In the perovskite structure, that is, $ABO_3$ structure, oxygen is 12-coordinated in the A-site thereof, and in the B-site thereof, oxygen is 6-coordinated to form an octahedron. For example, when the orientation control layer 65 contains Bi, Mn, Fe, and Ti, Bi is positioned in the A-site, and Mn, Fe, and Ti are positioned in the B-site.

The orientation control layer 65 may have such a thickness that the piezoelectric layer 70 formed on the orientation control layer 65 can be preferentially oriented to the (100) plane. The thickness is, for example, 5 nm to 20 nm. The orientation control layer 65 having such a thickness may not be provided on the whole surface, but be provided in an island shape. The expression "island shape" is a state in which a plurality of domains are formed to be separated from each other.

Here, the piezoelectric layer 70 varies in terms of various physical properties such as a displacement amount, a dielectric constant, and a Young's modulus and electrical characteristics such as a hysteresis curve and an I-V curve. Therefore, piezoelectric characteristics can be sufficiently exhibited by single orientation, that is, preferential orientation of the piezoelectric layer 70 using the orientation control layer 65 to the (100) plane.

The piezoelectric layer 70 according to the invention is made of a piezoelectric material expressed as a mixed crystal including a first component formed of a complex oxide containing Bi and Fe and having a rhombohedral perovskite structure and a complex oxide containing Ba and Ti and having a tetragonal perovskite structure, a second component formed of a complex oxide containing Bi, K, and Ti and having a tetragonal perovskite structure, and a third component formed of a complex oxide containing Bi, Mg, and Ti and having a rhombohedral perovskite structure, and is preferentially oriented to the (100) plane. In the A-site of the perovskite structure, Bi and Ba are positioned, and in the B-site thereof, Fe, Ti, and Mg are positioned. In this embodiment, a complex oxide having a composition expressed as a ternary mixed crystal of bismuth ferrate ($BiFeO_3$), barium titanate ($BaTiO_3$), and bismuth magnesium titanate ($BiMgTiO_3$) is used as the piezoelectric layer 70. Here, the first component is $Bi(Fe,Mn)O_3$—$BaTiO_3$, the second component is $(Bi_{0.5}K_{0.5})TiO_3$, and the third component is $Bi(Mg_{0.5}Ti_{0.5})O_3$. By simultaneously introducing $(Bi_{0.5}K_{0.5})TiO_3$ having a tetrahedral structure and $Bi(Mg_{0.5}Ti_{0.5})O_3$ having a rhombohedral structure to $BiFeMnO_3$—$BaTiO_3$, $Fe^{2+}$ is suppressed, a lattice distortion effect and a MPB effect can be utilized, and thus high piezoelectric displacement and a low leak current can be realized.

The piezoelectric layer 70 is formed through a thin film forming process. Here, the thin film forming process is a method of forming a thin film having a micron-order thickness using a chemical solution method, a laser ablation method, a sputtering method, a pulse laser deposition method (PLD method), a chemical vapor deposition method (CVD method), an aerosol deposition method, or the like. The thickness of the piezoelectric layer 70 formed through the thin film forming process is generally 3 µm or less, and preferably 0.6 µm to 1.2 µm.

The piezoelectric layer 70 formed of a complex oxide containing Bi, Fe, Ba, Ti, and Mg and having a perovskite structure has a composition expressed by (($Bi$,$Ba$)($Fe$,$Ti$,$Mg$)$O_3$). Representatively, by compositely adding bismuth potassium titanate (($Bi_{0.5}K_{0.5}$)$BaTiO_3$), abbreviated as "BKT") and bismuth magnesium titanate ($Bi(Mg_{0.5}Ti_{0.5})O_3$), abbreviated as "BMT") to a mixed crystal of bismuth ferrate (($BiFeO_3$), abbreviated as "BF") expressed by the following Formula (1) and barium titanate (($BaTiO_3$), abbreviated as "BT"), the displacement amount is significantly improved and the leak current can be significantly reduced.

This Formula (1) can also be expressed by the following Formula (1').

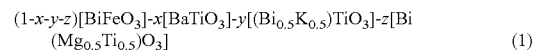

$$(1-x-y-z)[BiFeO_3]\text{-}x[BaTiO_3]\text{-}y[(Bi_{0.5}K_{0.5})TiO_3]\text{-}z[Bi(Mg_{0.5}Ti_{0.5})O_3] \quad (1)$$

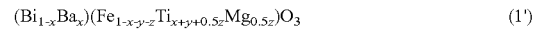

$$(Bi_{1-x}Ba_x)(Fe_{1-x-y-z}Ti_{x+y+0.5z}Mg_{0.5z})O_3 \quad (1')$$

where $0.25 \leq x \leq 0.30$, $0.05 \leq y \leq 0.10$, and $0.05 \leq z \leq 0.10$ are preferred.

Here, Formulas (1) and (1') express a stoichiometric composition, and as described above, an inevitable deviation in composition due to lattice mismatch, deficiency of a part of elements (Bi, Fe, Ba, K, Ti, Mg, and O), or the like and substitution of a part of elements are permitted as long as the perovskite structure is acquired. For example, when a stoichiometric ratio is 1, a stoichiometric ratio of 0.85 to 1.20 is permitted. In addition, complex oxides in which the ratio of the elements in the A-site and the elements in the B-site is the same may be regarded to be the same, even when being different from each other when being expressed by the formula as described below.

The stress applied to the piezoelectric layer 70 can be relaxed by inducing lattice defects in the crystal. Specifically, thermal stress generated in the baking process or the like when the piezoelectric layer 70 is formed, or stress generated when a voltage is applied can be relaxed. Accordingly, the generation of cracks can be suppressed.

Here, in the first, second, and third components, the ratio of the complex oxide of the rhombohedral crystal to the complex oxide of the tetragonal crystal (complex oxide of rhombohedral crystal/complex oxide of tetragonal crystal) is preferably 70/30 to 65/35. According to this, the lattice distortion effect and the MPB effect can be utilized, and thus high piezoelectric displacement and a low leak current can be realized.

The content of $(Bi_{0.5}K_{0.5})TiO_3$ in the piezoelectric layer 70 is preferably 5 mol % to 10 mol %. In the case of the third component, the content of $Bi(Mg_{0.5}Ti_{0.5})O_3$ is preferably 5 mol % to 10 mol %. The total content of the second component and the third component is preferably 10 mol % to 20 mol %.

The bismuth ferrate, barium titanate, and bismuth magnesium titanate configuring the piezoelectric layer 70 are known piezoelectric materials having a perovskite structure, and various compositions thereof are known. For example, as the bismuth ferrate, the barium titanate, and the bismuth magnesium titanate, materials having compositions in which there is deficiency or excess of a part of elements (Bi, Fe, Ba, K, Ti, Mg, and O), or compositions in which a part of elements is substituted with other elements are also known other than $BiFeO_3$, $BaTiO_3$, $(Bi_{0.5}K_{0.5})TiO_3$, and $Bi(Mg_{0.5}Ti_{0.5})O_3$. In the invention, when bismuth ferrate, barium titanate, and bismuth magnesium titanate are expressed, materials having a composition deviated from the stoichiometric composition by deficiency or excess or materials in which a part of elements is substituted with other elements are also included in the range of the bismuth ferrate, barium titanate, and bismuth magnesium titanate. The ratio of bismuth ferrate, barium titanate, and bismuth magnesium titanate can also be variously changed.

In addition, the complex oxide constituting the piezoelectric layer 70 preferably contains other elements such as manganese (Mn), cobalt (Co) and chromium (Cr) other than Bi, Fe, Ba, Ti, and Mg, and among these, Mn is more preferably contained. When Mn, Co, Cr, or the like is contained, leakage characteristics can be improved, and thus a lead-free piezoelectric material having excellent piezoelectric characteristics can be provided. When the piezoelectric layer 70 is a complex oxide containing other elements, it is required to have a perovskite structure.

When the piezoelectric layer 70 contains Mn, Co, or Cr, the Mn, Co, or Cr is positioned in the B-site. For example, when the piezoelectric layer 70 contains Mn, the complex oxide configuring the piezoelectric layer 70 is expressed as a complex oxide having a structure in which a part of Fe, Ti, and Mg of a solid solution in which bismuth ferrate, barium titanate, and bismuth magnesium titanate are uniformly solid-soluted is substituted with Mn, or a perovskite structure of a ternary mixed crystal of bismuth manganate ferrate, barium titanate, and bismuth magnesium titanate, and it is found that basic characteristics thereof are the same as a complex oxide having a perovskite structure of a ternary mixed crystal of bismuth ferrate, barium titanate, and bismuth magnesium titanate, but leakage characteristics thereof are further improved. When Co or Cr is contained, leakage characteristics are also improved as in the case of Mn. Here, it can be expressed by the following Formula (2) or (2').

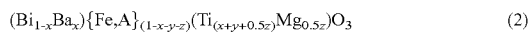  (2)

or:

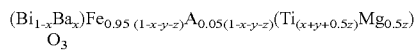

(where A indicates one or more selected from Mn, Co, and Cr) (2')
where $0.25 \leq x \leq 0.30$, $0.05 \leq y \leq 0.10$, and $0.05 \leq z \leq 0.10$ are preferred.

In the above description, the case in which the piezoelectric layer 70 contains Mn, Co, and Cr as other elements has been described. However, when two other transition metal elements are simultaneously contained, the leakage characteristics are found to be similarly improved and the piezoelectric layer 70 can be made therethrough. In addition, the piezoelectric layer 70 may further contain other known additives in order to the characteristics.

In an X-ray diffraction pattern, bismuth ferrate, barium titanate, bismuth magnesium titanate, bismuth manganese ferrate, bismuth cobalate ferrate, bismuth potassium titanate, bismuth chromate ferrate, and the like are not singly detected.

However, according to high-intensity synchrotron X-ray diffraction with beam line (BL02B2) of the synchrotron radiation facility (Spring-8) using an X-ray diffraction device (Rigaku RINT-2000, CuKα-ray), a peak belonging to the perovskite structure may be observed regarding a sintered body expressed as a ternary mixed crystal (BF-BT-BMT) of bismuth ferrate (BF), barium titanate (BT), and bismuth magnesium titanate (BMT) or a binary mixed crystal (BT-BMT) of barium titanate (BT) and bismuth magnesium titanate (BMT).

As the second electrode 80, any of various metals such as iridium (Ir), platinum (Pt), tungsten (W), tantalum (Ta), and molybdenum (Mo) may be used, and alloys thereof and metal oxides such as iridium oxide are also exemplified. A lead electrode 90 made of gold (Au) and the like and drawn from the vicinity of an end portion on the side of the ink supply path 14 to extend onto the channel forming substrate 10 is connected to each second electrode 80 which is an individual electrode of the piezoelectric element 300. The voltage is selectively applied to each piezoelectric element 300 via the lead electrode 90.

On the channel forming substrate 10 in which the piezoelectric elements 300 are formed, that is, on the first electrode 60, the elastic film 50, the insulating film which is provided if necessary, and the lead electrode 90, a protective substrate 30 having a manifold portion 31 configuring at least a part of a manifold 100 is bonded via an adhesive 35. In this embodiment, this manifold portion 31 is formed in a width direction of the pressure generation chamber 12 to pass through the protective substrate 30 in a thickness direction, and communicates with the communication portion 13 of the channel forming substrate 10 as described above to configure the manifold 100 acting as an ink chamber common to the pressure generation chambers 12. The communication portion 13 of the channel forming substrate 10 may be partitioned into a plurality of portions for each pressure generation chamber 12 and only the manifold portion 31 may act as the manifold. Moreover, for example, only the pressure generation chambers 12 may be provided in the channel forming substrate 10, and members (for example, elastic film 50, insulating film which is provided if necessary, and the like) interposed between the channel forming substrate 10 and the protective substrate 30 may be provided with the ink supply paths 14 communicating the manifold 100 with the respective pressure generation chambers 12.

A piezoelectric element holding portion 32 having such a space as not to disturb the movement of the piezoelectric element 300 is provided in a region in the protective substrate 30 opposed to the piezoelectric element 300. The piezoelectric element holding portion 32 may have such a space as not to disturb the movement of the piezoelectric element 300, and the space may be sealed, or may not be sealed.

As such a protective substrate 30, a material having almost the same coefficient of thermal expansion as the channel forming substrate 10, such as glass or a ceramic material, is preferably used. In this embodiment, the protective substrate 30 is formed using a silicon single crystal substrate made of the same material as the channel forming substrate 10.

The protective substrate 30 is provided with a through hole 33 passing through the protective substrate 30 in the thickness direction. The lead electrode 90 drawn from each piezoelectric element 300 is provided so that the vicinity of an end portion thereof is exposed to the inside of the through hole 33.

A driving circuit 120 for driving the arranged piezoelectric elements 300 is fixed to the protective substrate 30. As this driving circuit 120, for example, a circuit board, a semiconductor integrated circuit (IC), or the like can be used. The driving circuit 120 and the lead electrode 90 are electrically connected via connection wiring 121 formed of conductive wires such as bonding wires.

A compliance substrate 40 formed of a sealing film 41 and a stationary plate 42 is bonded to the protective substrate 30. Here, the sealing film 41 is made of a flexible material having low rigidity, and one surface of the manifold portion 31 is sealed with the sealing film 41. The stationary plate 42 is made of a relatively hard material. A region in the stationary plate 42 opposed to the manifold 100 is an opening portion 43 completely removed in the thickness direction, and thus one surface of the manifold 100 is sealed only with the flexible sealing film 41.

In such an ink jet recording head I of this embodiment, an ink is introduced from an ink inlet connected to external ink supply means (not shown) to fill the inside from the manifold 100 to the nozzle openings 21 with the ink. Then, a voltage is applied between the first electrode 60 and the second electrode 80 corresponding to the pressure generation chamber 12 in accordance with a recording signal from a driving circuit 120, and the vibrating plate 50, the adhesion layer 56, the first electrode 60, the seed layer 65, and the piezoelectric layer 70 are deflection-deformed to increase the pressure in each pressure generation chamber 12 to thus discharge ink droplets from the nozzle openings 21.

EXAMPLES

Hereinafter, the invention will be described in more detail with examples. The invention is not limited to the following examples.

Example 1

First, a silicon dioxide film having a thickness of 1200 nm was formed on a surface of a single crystal silicon (Si) substrate oriented to a (100) plane by thermal oxidation. Next, a titanium film having a thickness of 40 nm was formed on the silicon dioxide film through a RF magnetron sputtering method, and subjected to thermal oxidation to form a titanium oxide film (adhesion layer 56). Next, on the titanium oxide film, a platinum film having a thickness of 100 nm was formed through a RF magnetron sputtering method to act as an electrode (first electrode 60) oriented to a (111) plane.

Next, an orientation control layer 65 for preferentially orienting a piezoelectric layer 70 to the (100) plane was formed on the first electrode 60. The method is as follows. First, n-octane solutions of bismuth 2-ethylhexanoate and manganese 2-ethylhexanoate were mixed so that a molar concentration ratio of Bi to Mn was 100:100, and thus a precursor solution for an orientation control layer was prepared. Then, the precursor solution for an orientation control layer was added dropwise to the above-described substrate on which the titanium oxide film and the platinum film were formed, and the substrate was rotated at 3000 rpm to form an orientation control layer precursor film through a spin coating method (orientation control layer application process). Next, the film was dried for 2 minutes at 180° C. on a hot plate (orientation control layer drying process). Next, degreasing was performed for 2 minutes at 350° C. (orientation control layer degreasing process). Thereafter, the temperature was increased to 700° C. at 3° C./sec to perform baking for 2 minutes at 700° C. using a rapid thermal annealing (RTA) device in the oxide atmosphere, and thus an orientation control layer made of bismuth manganate was formed (orientation control layer baking process). Accordingly, the orientation control layer 65 formed of a complex oxide including Bi and Mn was obtained.

Next, a predetermined piezoelectric layer 70 having a perovskite structure was formed on the orientation control layer 65. The method is as follows. n-octane solutions of bismuth 2-ethylhexanoate, barium 2-ethylhexanoate, iron 2-ethylhexanoate, manganese 2-ethylhexanoate, magnesium 2-ethylhexanoate, and titanium 2-ethylhexanoate were mixed so that a molar ratio of Bi, Fe, Mn, Ba, Mg, K, and Ti was 72.5:61.75:3.25:25.0:2.5:2.5:32.5 (Bi:Fe:Mn:Ba:Mg:K:Ti), and thus a precursor solution was prepared.

Next, the precursor solution was added dropwise to the orientation control layer 65. The substrate was rotated for 6 seconds at 500 rpm, and then rotated for 20 seconds at 3000 rpm to form a film through a spin coating method. Next, the substrate was placed on a hot plate and dried for 2 minutes at 180° C. Next, the substrate was placed on the hot plate and subjected to degreasing for 2 minutes at 350° C. The process ranging from the application of the solution to the degreasing was repeated 2 times, and then baking was performed for 5 minutes at 750° C. using a RTA device in the oxide atmosphere. Next, the above-described processes were repeated six times to form the piezoelectric layer 70 through total 12 times of application.

Thereafter, as a second electrode 80, a platinum film having a thickness of 100 nm was formed through a RF magnetron sputtering method on the piezoelectric layer 70 to serve as the second electrode 80. Accordingly, a piezoelectric element 300 having the first electrode 60, the orientation control layer 65, the piezoelectric layer 70, and the second electrode 80 was obtained.

Example 2

A piezoelectric element 300 was produced by performing the same operations as in Example 1, except that as a precursor solution, a mixture obtained by mixing n-octane solutions of bismuth 2-ethylhexanoate, barium 2-ethylhexanoate, iron 2-ethylhexanoate, manganese 2-ethylhexanoate, magnesium 2-ethylhexanoate, and titanium 2-ethylhexanoate so that a molar ratio of Bi, Fe, Mn, Ba, Mg, K, and Ti was 67.5:57.0:3.0:30:2.5:2.5:37.5 (Bi:Fe:Mn:Ba:Mg:K:Ti) was used to form a piezoelectric layer 70.

Example 3

A piezoelectric element 300 was produced by performing the same operations as in Example 1, except that as a precursor solution, a mixture obtained by mixing n-octane solutions of bismuth 2-ethylhexanoate, barium 2-ethylhexanoate, iron 2-ethylhexanoate, manganese 2-ethylhexanoate, magnesium 2-ethylhexanoate, and titanium 2-ethylhexanoate so that a molar ratio of Bi, Fe, Mn, Ba, Mg, K, and Ti was 70.0:57.0:3.0:25:2.5:5:37.5 (Bi:Fe:Mn:Ba:Mg:K:Ti) was used to form a piezoelectric layer 70.

Example 4

A piezoelectric element 300 was produced by performing the same operations as in Example 1, except that as a precursor solution, a mixture obtained by mixing n-octane solutions of bismuth 2-ethylhexanoate, barium 2-ethylhexanoate, iron 2-ethylhexanoate, manganese 2-ethylhexanoate, magnesium 2-ethylhexanoate, and titanium 2-ethylhexanoate so that a molar ratio of Bi, Fe, Mn, Ba, Mg, K, and Ti was 70:52.25:2.75:25:5:5:40.0 (Bi:Fe:Mn:Ba:Mg:K:Ti) was used to form a piezoelectric layer 70.

Comparative Example 1

A precursor solution containing no Mg so that a molar ratio of Bi, Ba, Fe, Mn, and Ti was 75.0:71.25:3.75:25.0:25.0 (Bi:Fe:Ma:Ba:Ti) was prepared using the same solution as in Example 1. Using this precursor solution, the same operations as in Example 1 were performed, except that a piezoelectric layer 70 was formed through total 12 times of application, and thus a piezoelectric element 300 was produced by performing the same operations as in Example 1.

Test Example 1

Figure 6:
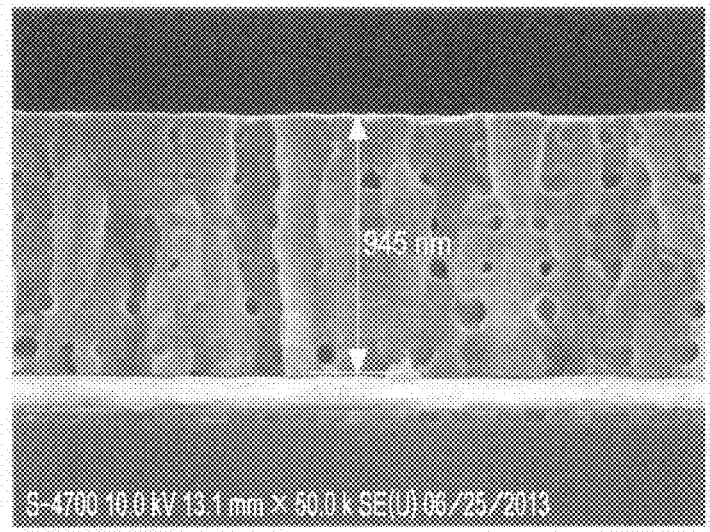
FIG. 6 is a SEM image of a comparative example.

SEM images obtained by observation using thin-film cross-sections of the piezoelectric elements of Examples 1 to 4 and Comparative Example 1 are shown. The results thereof are shown in FIGS. 4 to 6. From the results, it was found that morphology changes of the BFM-BT thin film caused by the addition of BKT+BMT are hardly shown.

Test Example 2

Figure 7:
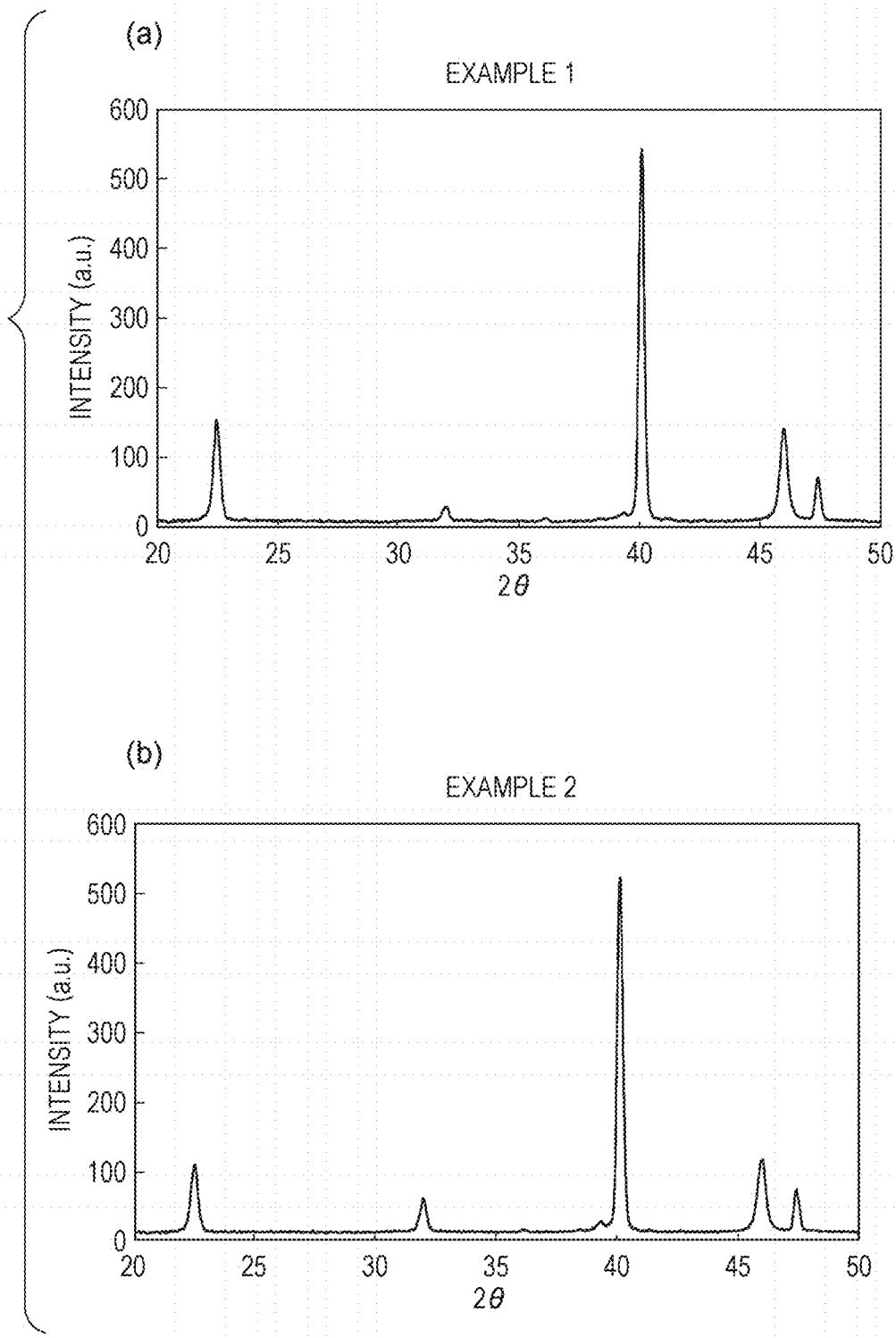
FIG. 7 shows X-ray diffraction patterns of the examples.
Figure 8:
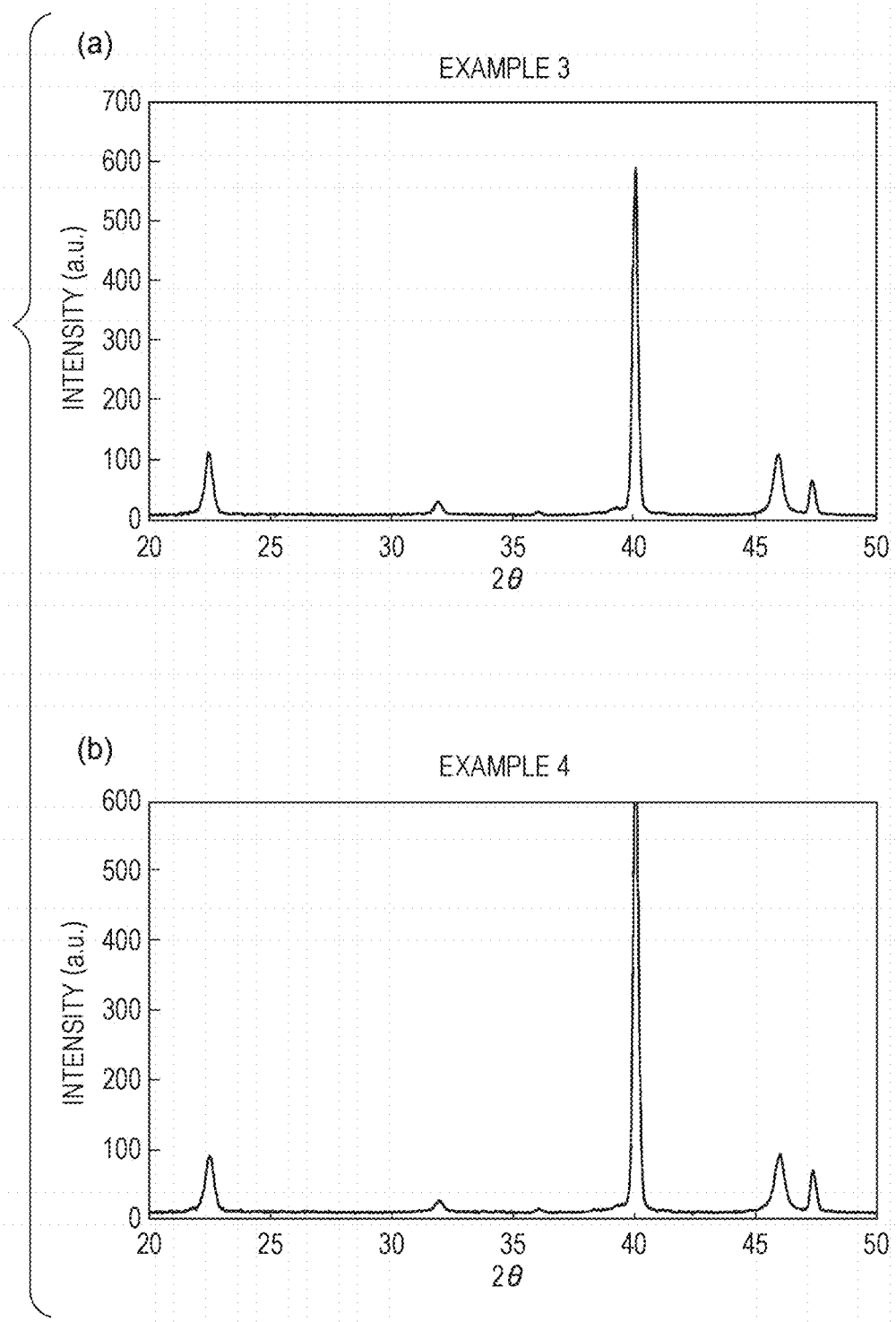
FIG. 8 shows X-ray diffraction patterns of the examples.
Figure 9:
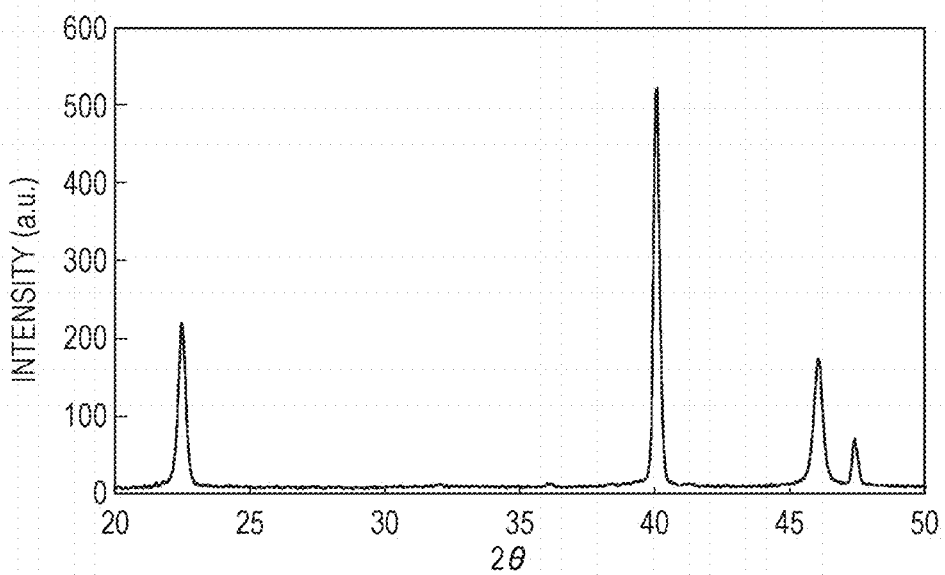
FIG. 9 is a diagram showing an X-ray diffraction pattern of the comparative example.

The piezoelectric layers of Examples 1 to 4 and Comparative Example 1 were subjected to X-ray diffraction measurement using "D8 Discover" manufactured by Bruker AXS GmbH. X-ray diffraction patterns of Examples 1 to 4 and Comparative Example 1 are shown in FIGS. 7 to 9. From the XRD measurement results, it was found that all of the samples have preferential crystal orientation to a (100) plane and the degree of orientation depends on the BT amount and the BKT+BMT amount.

Test Example 3

Figure 10:
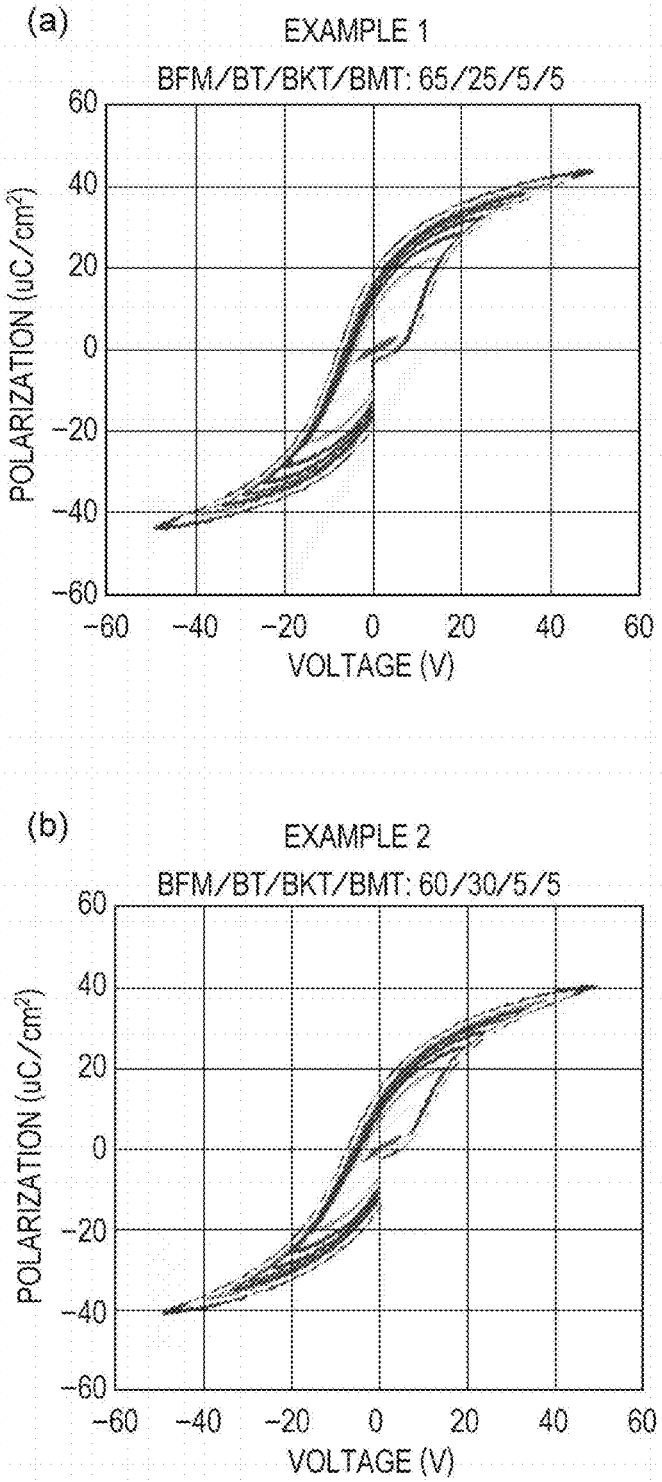
FIG. 10 shows the relationship between P and V of the examples.
Figure 11:
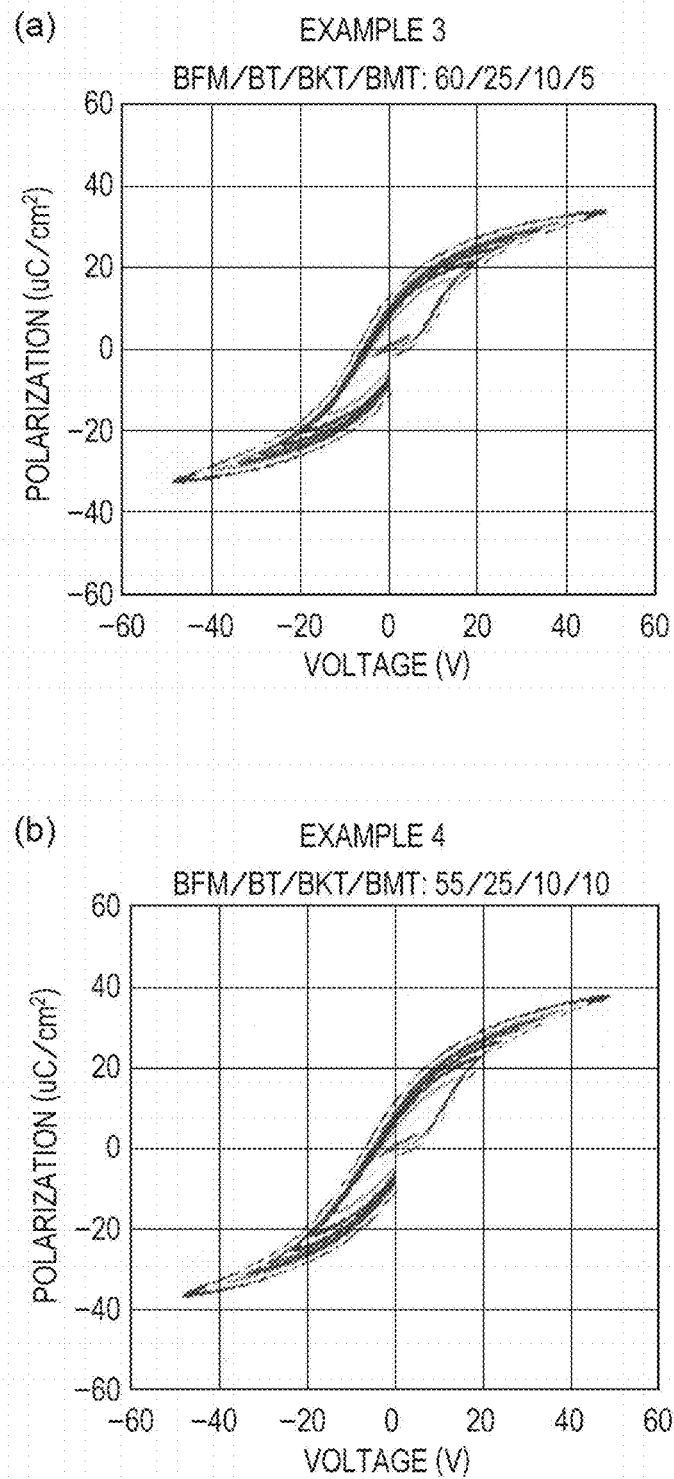
FIG. 11 shows the relationship between P and V of the examples.
Figure 12:
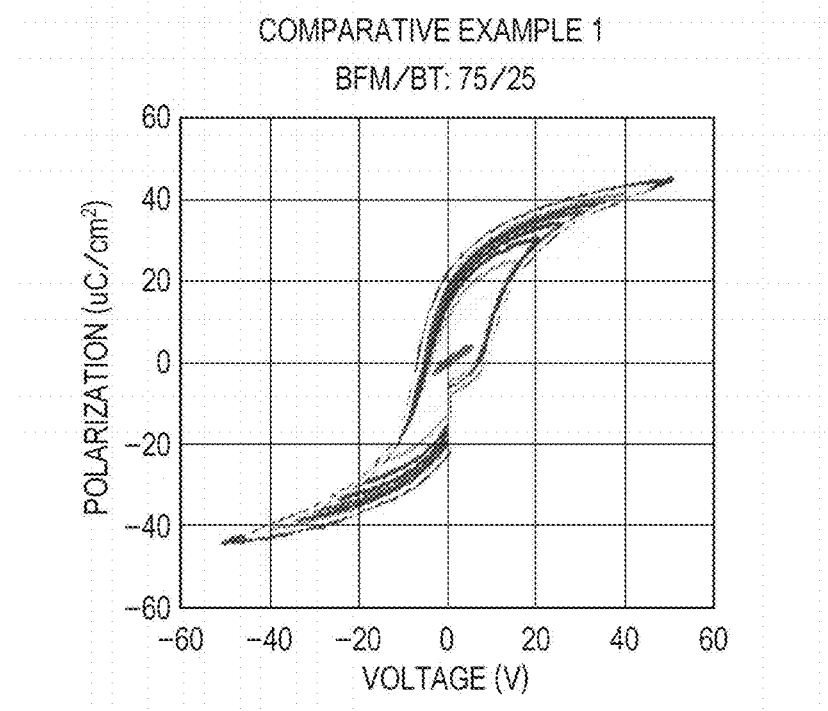
FIG. 12 shows the relationship between P and V of the comparative example.
Figure 13:
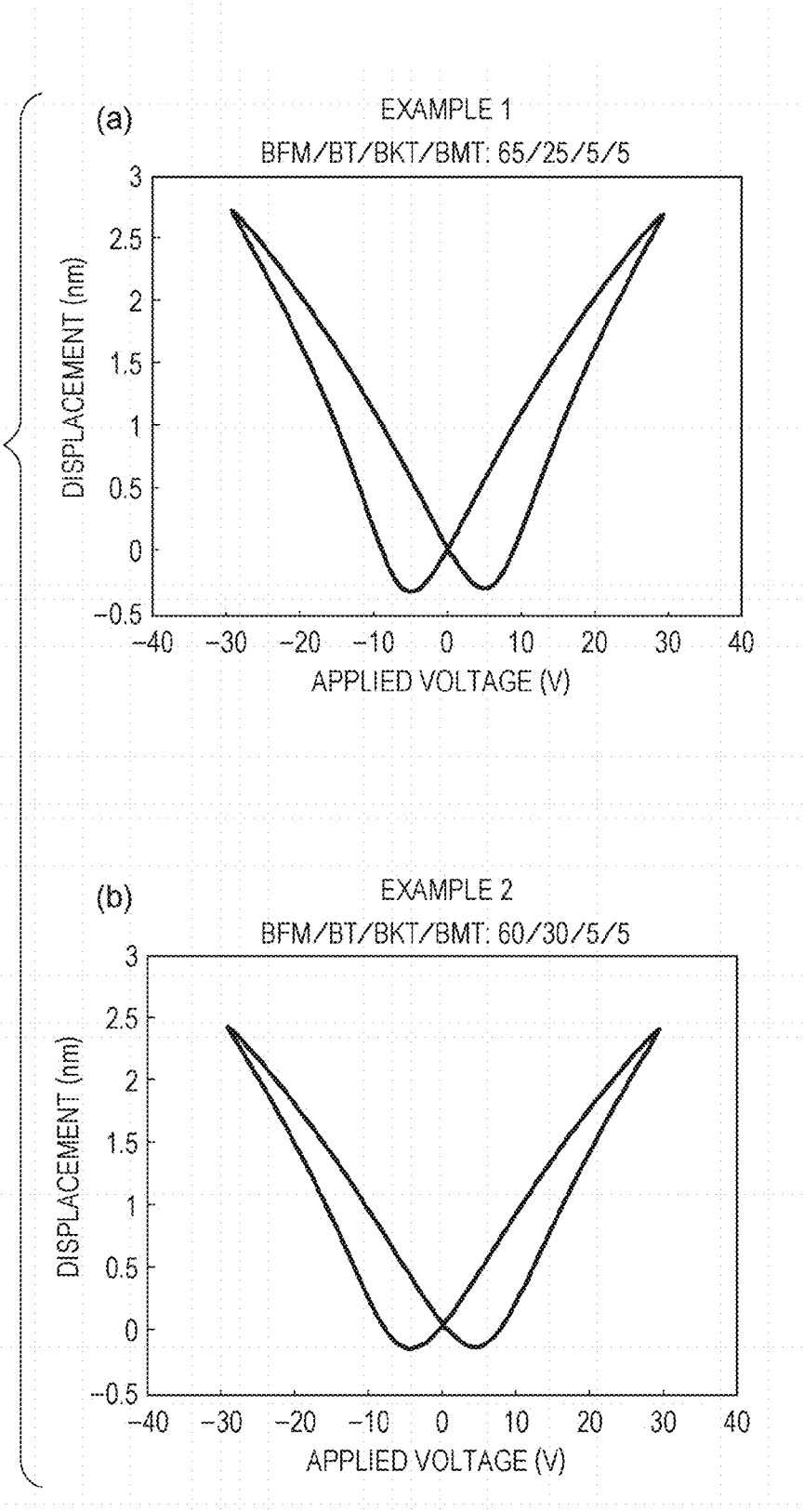
FIG. 13 shows the relationship between S and V of the examples.
Figure 14:
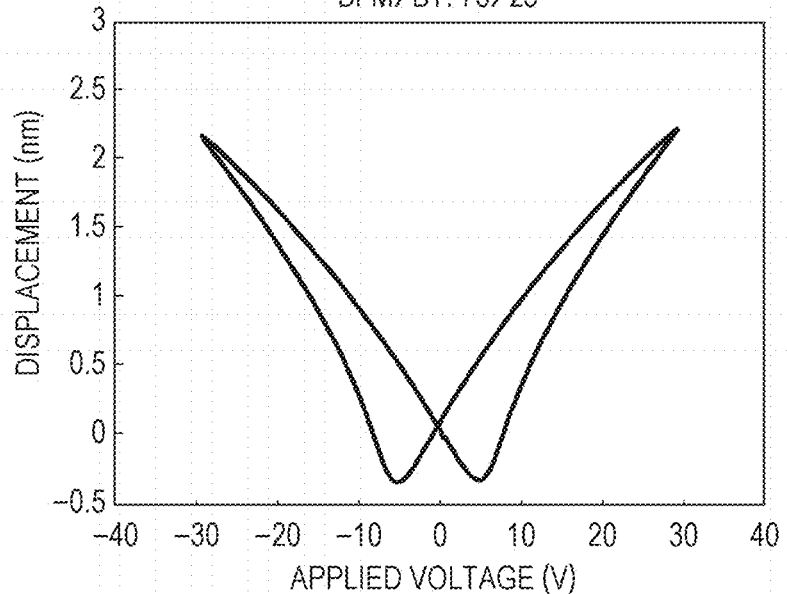
FIG. 14 shows the relationship between S and V of the comparative example.

A triangular wave at a frequency of 1 kHz was applied to the piezoelectric elements of Examples 1 to 4 and Comparative Example 1 at room temperature (25° C.) using an electrode pattern of $\phi$=500 μm with "FCE-1A" manufactured by Toyo Corporation to obtain the relationship between a polarization quantity P and a voltage (hysteresis curve) and the relationship between S (electric field-induced distortion (displacement amount)) and V (voltage) (butterfly). FIGS. 10 and 11 show hysteresis curves of Examples 1 to 4, and FIG. 12 shows a hysteresis curve of Comparative Example 1. FIG. 13 shows butterfly curves of Examples 1 and 2, and FIG. 14 shows a butterfly curve of Comparative Example 1. The driving method is based on bipolar driving.

As a result, it was found that rectangularity is small in the examples in which the addition of BKT+BMT was performed.

Test Example 4

Figure 15:
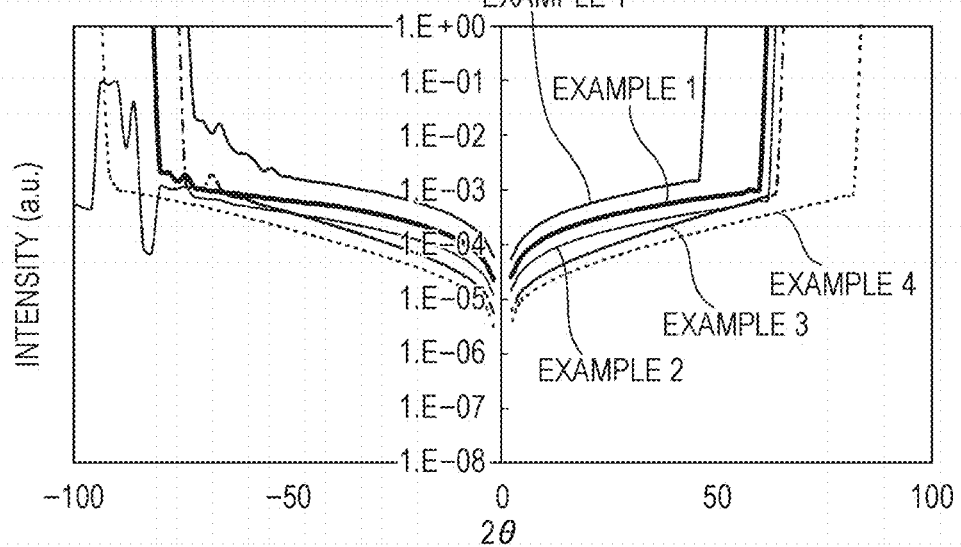
FIG. 15 shows the relationship between a current density and a voltage of the examples and the comparative example.

The relationship (I-V curve) between a current density and a voltage was obtained by applying a voltage of ±50 V to the piezoelectric elements of Examples 1 to 4 and Comparative Example 1. The measurement of the I-V curve was performed using "4140B" manufactured by Hewlett-Packard Company under the atmosphere with a holding time of 2 seconds upon measurement. In addition, the measurement was performed by eliminating the influence of a photoelectromotive force and the like using a shielded prober. The measurement results of Examples 1 to 4 and Comparative Example 1 are shown in FIG. 15.

From the results of FIGS. 10 to 15, it was found that in Examples 1 to 4, the leak current is significantly reduced by the addition of BKT+BMT. When the BFM amount in the composition is reduced, the $Fe^{2+}$ amount is reduced. In addition, Ti in the BKT and BMT is thought to have an effect on electricity cost stabilization of $Fe^{3+}$, and as a result, the leak current is thought to be reduced.

Test Example 5

A voltage of 30 V was applied to the piezoelectric elements of Examples 1 to 4 and Comparative Example 1 using a displacement measuring device (DBLI) manufactured by aix-ACCT Systems, Inc., at a frequency of 1 kHz with the use of an electrode pattern of $\phi$=500 μm at room temperature to measure an electric field-induced distortion (displacement amount) in bipolar driving and in unipolar driving.

As a result, in Examples 1 to 4, the displacement amount was improved by 24% as compared to Comparative Example 1.

Other Embodiments

Although each embodiment of the invention has been described as above, the basic configuration of the invention is not limited to the above description. For example, in the above-described embodiment, a silicon single crystal substrate is exemplified as the channel forming substrate 10, but the channel forming substrate 10 is not particularly limited thereto. For example, a SOI substrate or a material such as glass may be used.

In the above-described embodiment, the piezoelectric element 300 in which the first electrode 60, the orientation control layer 65, the piezoelectric layer 70, and the second electrode 80 are sequentially stacked on the substrate (channel forming substrate 10) has been exemplified, but is not limited to this configuration. The invention can also be applied to, for example, a longitudinal vibration-type piezoelectric element in which a piezoelectric material and an electrode forming material are alternately stacked and stretched in an axial direction.

In the above-described Embodiment 1, the liquid ejecting head in which the first electrode 60 configures a common electrode provided continuously in the direction in which the pressure generation chambers 12 are arranged, and the second electrode 80 configures an individual electrode provided individually corresponding to the pressure generation chamber 12 has been exemplified. However, a configuration may also be employed in which the first electrode 60 configures an individual electrode provided individually corresponding to the pressure generation chamber 12, and the second electrode 80 configures a common electrode provided continuously in the direction in which the pressure generation chambers 12 are arranged.

Figure 16:
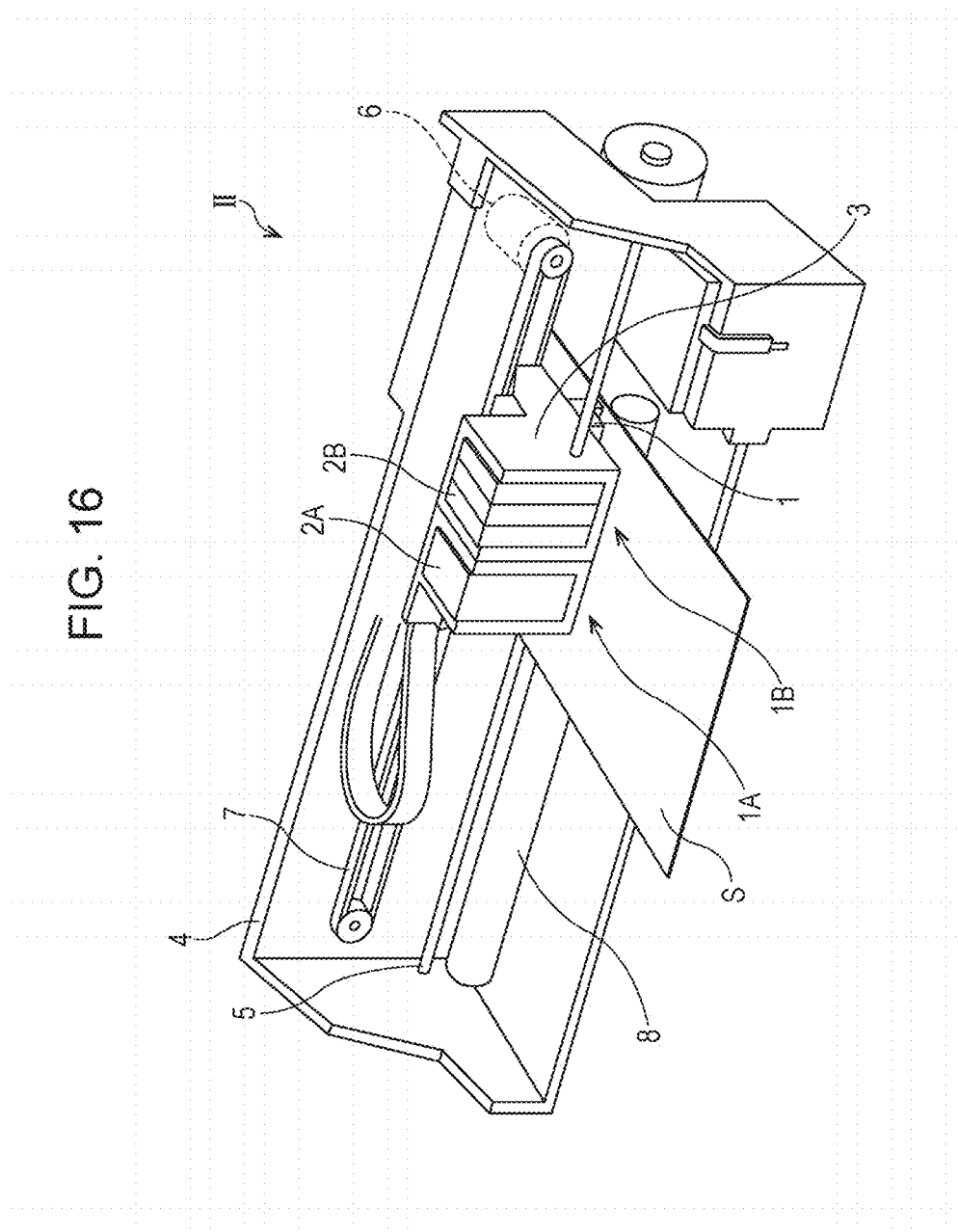
FIG. 16 is a diagram showing a schematic configuration of a recording apparatus according to an embodiment of the invention.

The ink jet recording head I (see FIG. 1) is mounted on, for example, an ink jet recording apparatus II as shown in FIG. 16. Cartridges 2A and 2B configuring ink supply means are detachably provided on recording head units 1A and 1B having the ink jet recording head I, and a carriage 3 on which the recording head units 1A and 1B are mounted is provided on a carriage shaft 5 attached to an apparatus main body 4 so as to be movable in a shaft direction. The recording head units 1A and 1B eject, for example, a black ink composition and color ink compositions.

The carriage 3 on which the recording head units 1A and 1B are mounted is moved along the carriage shaft 5 by the transfer of the driving force of a driving motor 6 to the carriage 3 via a plurality of toothed wheels (not shown) and a timing belt 7. In the apparatus main body 4, a transport roller 8 is provided as transport means and a recording sheet S which is a recording medium such as paper is transported by the transport roller 8. The transport means for transporting a recording sheet S is not limited to the transport roller, and may be a belt, a drum, or the like.

In the above-described examples, the apparatus in which the ink jet recording head I is mounted on the carriage 3 and moved in a main scanning direction has been exemplified as the ink jet recording apparatus II, but its configuration is not particularly limited. The ink jet recording apparatus II may be, for example, a so-called line-type recording apparatus in which the ink jet recording head I is fixed and a recording sheet S such as paper is moved in a sub-scanning direction to perform printing.

In the above-described embodiments, the ink jet recording head has been described as an example of the liquid ejecting head provided with the piezoelectric element. However, the invention is widely provided for general liquid ejecting heads and can also be applied to liquid ejecting heads which eject a liquid other than an ink. Examples of other liquid ejecting heads include various recording heads which are used in image recording apparatuses such as printers, color material ejecting heads which are used in the manufacturing of color filters of liquid crystal displays and the like, electrode material ejecting heads which are used in the formation of electrodes of organic EL displays and field emission displays (FED), and bioorganic material ejecting heads which are used in the manufacturing of biochips.

The piezoelectric element 300 according to the invention can be used by being mounted on various sensors. Examples of the various sensors include a pyroelectric sensor, an infrared sensor, a terahertz sensor, a temperature sensor, an ultrasonic sensor, a thermosensitive sensor, a pressure sensor, an acceleration sensor, and a gyro sensor (angular velocity sensor). In cases of these sensors, the leak current is reduced, and thus the sensors have a piezoelectric element with an improved displacement amount. Accordingly, the sensor have high detection sensitivity.

The piezoelectric element 300 according to the invention can be appropriately used as a ferroelectric element. Examples of the ferroelectric element include a ferroelectric memory (FeRAM), a ferroelectric transistor (FeFET), a ferroelectric arithmetic circuit (FeLogic), and a ferroelectric capacitor.

The piezoelectric element 300 according to the invention can be appropriately used as an optical element. Examples of the optical element include a wavelength converter, an optical waveguide, a filter for shielding harmful rays such as infrared rays, an optical filter using a photonic crystal effect caused by the formation of quantum dots, an optical filter using optical interference of a thin film, and a light-heat conversion filter using a certain pattern structure.

The piezoelectric element 300 according to the invention can be used by being mounted on a power generation device. Examples of the power generation device include a power generation device using a pressure-electricity conversion effect, a power generation device using electronic excitation (photovoltaic power) by light, a power generation device using electronic excitation (thermoelectric power) by heat, and a power generation device using vibration.

The piezoelectric element 300 according to the invention is not limited to piezoelectric elements which are used in the above-described liquid ejecting head, the liquid ejecting apparatus having the liquid ejecting head, various sensors, ferroelectric elements, optical elements, and power generation devices, and can also be used in other devices. Examples of other devices include ultrasonic devices such as ultrasonic transmitters, ultrasonic motors, piezoelectric transformers, piezoelectric motors, and vibration-type dust removing devices.

The invention claimed is:

1. A piezoelectric element comprising:
a first electrode;
a piezoelectric layer which is provided on the first electrode; and
a second electrode which is provided on the piezoelectric layer,
wherein the piezoelectric layer is made of a piezoelectric material expressed as a mixed crystal including a first component formed of a complex oxide containing Bi and Fe and having a rhombohedral perovskite structure and a complex oxide containing Ba and Ti and having a tetragonal perovskite structure, a second component formed of a complex oxide containing Bi, K, and Ti and having a tetragonal perovskite structure, and a third component formed of a complex oxide containing Bi, Mg, and Ti and having a rhombohedral perovskite structure.

2. The piezoelectric element according to claim 1, wherein the first component is $Bi(Fe,Mn)O_3$—$BaTiO_3$, the second component is $(Bi_{0.5}K_{0.5})TiO_3$, and the third component is $Bi(Mg_{0.5}Ti_{0.5})O_3$.

3. The piezoelectric element according to claim 2, wherein in the first, second, and third components, the ratio of the complex oxide of the rhombohedral crystal to the complex oxide of the tetragonal crystal (complex oxide of rhombohedral crystal/complex oxide of tetragonal crystal) is 70/30 to 65/35.

4. The piezoelectric element according to claim 2, wherein the content of the complex oxide containing Ba and Ti and having a tetragonal perovskite structure is 25 mol % to 30 mol %.

5. The piezoelectric element according to claim 1, wherein in the first, second, and third components, the ratio of the complex oxide of the rhombohedral crystal to the complex oxide of the tetragonal crystal (complex oxide of rhombohedral crystal/complex oxide of tetragonal crystal) is 70/30 to 65/35.

6. The piezoelectric element according to claim 5, wherein the content of the complex oxide containing Ba and Ti and having a tetragonal perovskite structure is 25 mol % to 30 mol %.

7. The piezoelectric element according to claim 1, wherein the content of the complex oxide containing Ba and Ti and having a tetragonal perovskite structure is 25 mol % to 30 mol %.

8. The piezoelectric element according to claim 1, wherein the content of the second component is 5 mol % to 10 mol %.

9. The piezoelectric element according to claim 1, wherein the content of the third component is 5 mol % to 10 mol %.

10. The piezoelectric element according to claim 1,
wherein the total content of the second component and the third component is 10 mol % to 20 mol %.

11. The piezoelectric element according to claim 1,
wherein an orientation control layer made of bismuth manganate is formed between the first electrode and the piezoelectric layer.

12. A liquid ejecting head comprising:
the piezoelectric element according to claim 1.

13. A liquid ejecting apparatus comprising:
the liquid ejecting head according to claim 12.

14. An actuator and a sensor each comprising:
the piezoelectric element according to claim 1.

15. A piezoelectric material which is formed of a piezoelectric material expressed as a mixed crystal including a first component formed of a complex oxide containing Bi and Fe and having a rhombohedral perovskite structure and a complex oxide containing Ba and Ti and having a tetragonal perovskite structure, a second component formed of a complex oxide containing Bi, K, and Ti and having a tetragonal perovskite structure, and a third component formed of a complex oxide containing Bi, Mg, and Ti and having a rhombohedral perovskite structure.

\* \* \* \* \*